United States Patent
Obuchi et al.

(10) Patent No.: US 8,080,438 B2
(45) Date of Patent: Dec. 20, 2011

(54) ORGANIC SEMICONDUCTOR FILM FORMING METHOD, ORGANIC SEMICONDUCTOR FILM AND ORGANIC THIN FILM TRANSISTOR

(75) Inventors: Reiko Obuchi, Tokyo (JP); Katsura Hirai, Tokyo (JP); Chiyoko Takemura, Tokyo (JP)

(73) Assignee: Konica Minolta Holdings, Inc., Tokyo (JP)

( * ) Notice: Subject to any disclaimer, the term of this patent is extended or adjusted under 35 U.S.C. 154(b) by 1033 days.

(21) Appl. No.: 11/922,857

(22) PCT Filed: Jun. 23, 2006

(86) PCT No.: PCT/JP2006/312576
§ 371 (c)(1),
(2), (4) Date: Dec. 20, 2007

(87) PCT Pub. No.: WO2006/137512
PCT Pub. Date: Dec. 28, 2006

(65) Prior Publication Data
US 2010/0090199 A1 Apr. 15, 2010

(30) Foreign Application Priority Data
Jun. 24, 2005 (JP) .................................. 2005-185267

(51) Int. Cl.
*H01L 21/00* (2006.01)

(52) U.S. Cl. ..................... 438/82; 438/99; 257/E21.024
(58) Field of Classification Search ................... 438/82, 438/99, 478; 257/E21.024
See application file for complete search history.

(56) References Cited

U.S. PATENT DOCUMENTS

| 7,795,611 B2* | 9/2010 | Nakamura | 257/40 |
| 2004/0186265 A1* | 9/2004 | Liu et al. | 528/377 |
| 2005/0258417 A1* | 11/2005 | Minakata | 257/40 |

FOREIGN PATENT DOCUMENTS

| JP | 2004-273678 | 9/2004 |
| WO | WO 03/016599 | 2/2003 |

OTHER PUBLICATIONS

S.C. Lim et al., "Surface-treatment effects on organic thin-film transistors", Synthetic Metals 148, pp. 75-79, 2005.

* cited by examiner

*Primary Examiner* — Michael Trinh
(74) *Attorney, Agent, or Firm* — Cozen O'Connor

(57) ABSTRACT

A method for forming an organic semiconductor film having a high carrier mobility is provided by having an average volatilization rate of a solvent within a prescribed range during a step of drying, at the time of applying a coating solution, which includes an organic semiconductor material and a non-halogen solvent, on a substrate. In such forming method, characteristic fluctuation in repeated use of the organic semiconductor film is suppressed, and an organic thin film transistor having an excellent film forming characteristic even on an insulator with reduced gate voltage threshold can be obtained.

11 Claims, 1 Drawing Sheet

US 8,080,438 B2

ORGANIC SEMICONDUCTOR FILM FORMING METHOD, ORGANIC SEMICONDUCTOR FILM AND ORGANIC THIN FILM TRANSISTOR

RELATED APPLICATIONS

This is a U.S. National Phase Application under 35 USC 371 of International Application PCT/JP2006/312576 filed on Jun. 23, 2006.

This application claims the priority of Japanese application no. 2005-185267 filed Jun. 24, 2005, the entire content of which is hereby incorporated by reference.

BACKGROUND OF THE INVENTION

1. Technical Field

The present invention relates to a method for forming an organic semiconductor film and an organic semiconductor film, and a method for producing an organic thin-film transistor.

2. Background

In recent years, various organic thin-film transistors, in which organic semiconductors are employed as a semiconductor channel, have been investigated. Organic semiconductors are more easily processed compared to inorganic semiconductors, and also exhibit high affinity to a plastic support, whereby they have received attention as a thin-film device.

Methods for forming an organic semiconductor film are represented by the method employing vapor deposition, and various methods are employed depending on characteristics of the materials. Under such situations, many trials have been made, which intends to more easily prepare an organic semiconductor film of enhanced carrier mobility, compared to vapor deposition, by employing a normal pressure process (being a wet process) which employs coating or application of a solution or a liquid composition onto a substrate.

For example, of trials to prepare organic semiconductor films employing solution layer lamination, enhancement of organic semiconductor polymer arrangement was tried via an orientation film (refer, for example, to Patent Document 1). Further, an organic semiconductor film or an organic semiconductor layer exhibiting high carrier mobility is formed in such a manner that a thiophene polymer solution exhibiting high mobility is employed and coating is carried out while drying solvents (refer, for example, to Non-patent Document 1).

However, during formation of the organic semiconductor layer, the carrier mobility is determined via crystals or the arrangement such as a n-stack of a structure body, whereby a problem occurs in which the mobility of the semiconductor layer prepared via the method in which an organic semiconductor solution is simply coated followed by drying solvents is still too low. Further, at the same time, pointed out are problems such as characteristic variation during repeated determination and the high threshold gate voltage.

Further, as problems during formation of a semiconductor layer, in order to enhance mobility, many low soluble semiconductor materials, such as pentacene, have been reported, which resulted in relatively high performance. Prospectively, in order to realize formation of a semiconductor layer via coating, highly soluble semiconductor materials have been increasingly developed. On the other hand, it is common knowledge that in order to enhance performance, those which are subjected to a surface treatment such as a surface hydrophobic treatment, are appropriate, while due to the above treatment, it has become more difficult to coat a semiconductor solution.

Patent Document 1: International Patent Publication No. 01/47043 Pamphlet

Non-patent Document 1: J. Am. Chem. Soc., 2004, 126, 3378

DESCRIPTION OF THE INVENTION

Problems to be Dissolved

An object of the present invention is to provide an organic semiconductor film forming method capable of forming a semiconductor layer of a high carrier mobility via a coating method, also to provide an organic semiconductor film which is subjected to retardation of characteristic variation during repeated use (measurement) of the organic semiconductor film and exhibits high film forming capability, even on an insulator, which are subjected to a decrease in the threshold of gate voltage and are subjected to a surface treatment, and further to provide an organic thin-film transistor having the organic semiconductor film formed via these methods.

Technical Means to Dissolve the Problem

The above object of the present invention was achieved employing the following embodiments.

1. In an organic semiconductor film forming method in which an organic semiconductor film is formed by that after supplying a liquid coating composition containing an organic semiconductor material and a non-halogenated solvent onto a substrate and drying, the organic semiconductor film forming method which is characterized in that an average volatilization rate of the aforesaid non-halogenated solvent during coating is $10^{-4}$-$10^3$ mg/(sec·cm$^2$).

2. The organic semiconductor film forming method described in 1. above, which is characterized in that the average volatilization rate of the aforesaid non-halogenated solvent during coating is $10^{-3}$-$10^3$ mg/(sec·cm$^2$).

3. The organic semiconductor film forming method described in 1. or 2. above, which is characterized in that the average volatilization rate of the aforesaid non-halogenated solvent during coating is controlled by controlling the substrate temperature or the liquid coating composition temperature.

4. The organic semiconductor film forming method described in any one of 1.-3. above, which is characterized in that a weight average molecular weight of the aforesaid organic semiconductor material is at most 5,000.

5. The organic semiconductor film forming method described in any one of 1.-4. above, which is characterized in that the aforesaid organic semiconductor material contains an alkylthiophene oligomer.

6. The organic semiconductor film forming method described in any one of 1.-4. above, which is characterized in that the aforesaid organic semiconductor material is a pentacene derivative.

7. The organic semiconductor film forming method described in any one of 1.-6. above, which is characterized in that the aforesaid non-halogenated solvent is an aromatic hydrocarbon solvent.

8. The organic semiconductor film forming method described in any one of 1.-7. above, which is characterized in that the aforesaid substrate is one which has not been subjected to a surface treatment.

9. The organic semiconductor film forming method described in any one of 1.-8. above, which is characterized in that temperature of aforesaid substrate is 20-100° C.

10. The organic semiconductor film forming method described in any one of 1.-9. above, which is characterized in that temperature of the aforesaid liquid coating composition is 20-100° C.
11. The organic semiconductor film forming method described in any one of 1.-10. above, which is characterized in that supply of the aforesaid liquid coating composition onto a substrate is substantially carried out in an ambience of nitrogen gas.
12. An organic semiconductor film which is characterized in that the organic semiconductor film is formed via the organic conductor film forming method described in any one of 1.-11. above.
13. An organic thin-film transistor which is characterized in that the organic thin-film transistor has the organic semiconductor film described in 12. above.

Advantage of the Invention

According to the present invention, it was intended to provide an organic semiconductor film forming method capable of forming a semiconductor layer of a high carrier mobility via a coating method, and also to provide an organic semiconductor film forming method capable of preparing an organic thin-film transistor to provide an organic semiconductor film which is subjected to retardation of characteristic variation during repeated use (measurement) of the organic semiconductor film, and further exhibits high film forming capability even on insulators which are subjected to a decrease in the threshold of gate voltage and are subjected to a surface treatment. Further it was possible to provide an organic thin-film transistor having the organic semiconductor film formed via these methods.

DESCRIPTION OF THE NUMERALS

Figure 1:
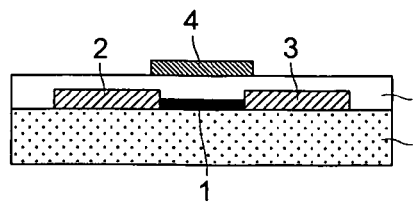
FIG. 1 is a schematic view showing examples of the of structure of the organic thin-film transistor according to the present invention.
Figure 1:
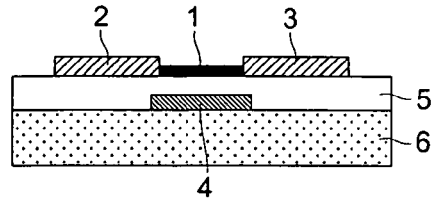
Figure 1:
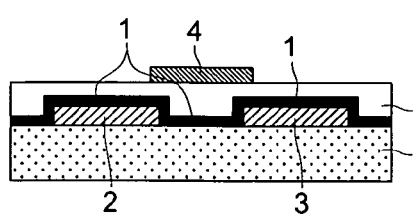
Figure 1:
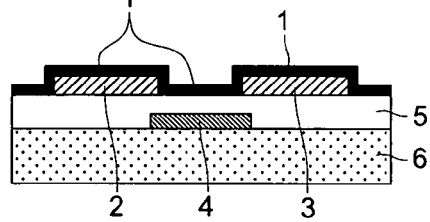
Figure 1:
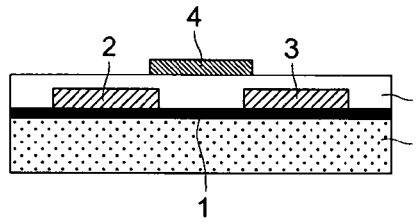
Figure 1:
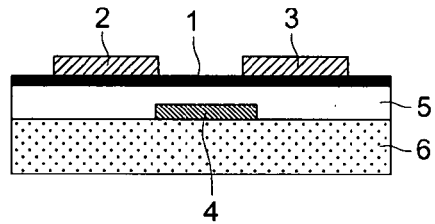

| | |
|---|---|
| 1 | organic semiconductor layer |
| 2 | source electrode |
| 3 | drain electrode |
| 4 | gate electrode |
| 5 | insulating layer |
| 6 | support |
| 7 | gate bus line |
| 8 | source bus line |
| 10 | organic TFT sheet |
| 11 | organic TFT |
| 12 | output element |
| 13 | storage condenser |
| 14 | vertical drive circuit |
| 15 | horizontal drive circuit |
| 16 | precision balance fitted with heating mechanism while monitoring weight change |
| 17 | substrate |
| 18 | solution (containing organic semiconductor materials and non-halogenated solvents) |

OPTIMAL EMBODIMENT OF THE INVENTION

By employing the organic semiconductor film producing method of the present invention, it has become possible to provide an organic semiconductor film forming method capable of forming a semiconductor layer of a high carrier mobility via a coating method by achieving the constitution specified in any one of 1.-14. above. Further, by these methods, it has become possible to provide an organic film transistor having the organic semiconductor layer formed via any of these methods.

Each of the constituting components related to the present invention will sequentially be detailed.

<<Organic Semiconductor Film Forming Method>>

The organic semiconductor film forming method of the present invention will now be described.

In the organic semiconductor film forming method of the present invention, it is possible to arrange an organic semiconductor film in such a manner that a liquid coating composition (in which organic semiconductor materials are dissolved or dispersed) is applied onto the substrate via a wet process such a cast coating, spin coating, printing, or an ink-jet method.

The content of the organic semiconductor materials in a liquid coating composition varies depending on the specific selection of the above organic semiconductor materials. However, in order to form a thin-film by applying these organic semiconductor materials onto a substrate, in view of enabling uniform spreading of the liquid coating composition and minimizing pin holes during coating due to coating composition shortage on the substrate, the content of organic semiconductor materials in the liquid coating composition is commonly 0.01-10.0% by weight, but is preferably 0.1-5.0% by weight. Further, a completely dissolved state is more preferable than a dispersed state.

The thickness of the organic semiconductor film (also called the organic semiconductor layer) is not particularly limited, and in many cases, characteristics of the resulting organic semiconductor film transistor (TFT) largely depend on the thickness of semiconductor layers. The thickness, though it varies depending on organic semiconductor materials, is preferably at most 1 μm, but is most preferably 10-300 nm.

Control Method for Average Volatilization Rate

As noted above, organic semiconductor materials applied onto a substrate are subjected to film formation along with volatilization of liquid in the liquid coating composition, and the crystalline state of the organic semiconductor film is greatly affected by the above process. Crystallization of the organic semiconductor materials is promoted by the presence of the liquid in the liquid coating composition, resulting in enhancement of carrier mobility. It is assumed that a low solvent drying rate results in enhancement of performance of the resulting semiconductors. At the same time, performance of organic semiconductor elements is enhanced via enhancement of adhesion onto the insulation layer which has been subjected to a surface treatment on the substrate surface via enhancement of film forming capability due to volatilization of solvents.

The inventors of the present invention discovered the optimal average volatilization rate of the liquid contained in the liquid coating composition so that crystallization of these organic semiconductor films and adhesion onto the surface of these insulation layers are compatibly enhanced. Namely, the present invention is characterized in that in an organic semiconductor film forming method in which an organic semiconductor film is formed on a substrate by supplying a liquid coating composition, containing organic semiconductor material, onto a substrate followed by drying, the average volatilization rate of the liquid contained in the above liquid coating composition is commonly regulated to $10^{-4}$-$10^3$ mg/(sec·cm$^2$), but preferably to $10^{-3}$-$10^3$ mg/(sec·cm$^2$).

Methods for regulating the average volatilization rate within the above range include regulation of the amount and concentration of the liquid coating composition supplied onto the substrate surface, regulation of the temperature of the substrate and the liquid coating composition, selection of solvents, and a decrease or increase of pressure. Of these, preferred is regulation of the temperature of the substrate and the liquid coating composition. Further, it is possible to calculate the average volatilization rate based on the amount of volatilization which is obtained by subtracting the weight immediately after coating from the weight just prior to complete drying.

<<Determination Method of Average Volatilization Rate>>

In the organic semiconductor film forming method, a method to determine the average volatilization rate of non-halogenated solvents during coating of a solution containing organic semiconductor materials and non-halogenated solvents will now be described with reference to FIG. 3.

Figure 3:
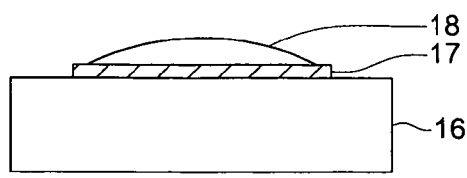
FIG. 3 is a schematic sectional view showing a state in which a liquid containing organic semiconductor materials and non-halogenated solvents is applied onto a substrate arranged on a precision balance.

FIG. 3 is a schematic sectional view showing a state in which a solution, containing organic semiconductor materials and non-halogenated solvents, is applied onto a substrate placed on a precision balance. The above precision balance is improved by modifying a commercial precision balance by being fitted with a heating mechanism while monitoring its weight change.

When the average volatilization rate is determined, 30 mg of a solution (containing organic semiconductor materials and non-halogenated solvents) is supplied onto the substrate via a glass dropper or an ink-jet head for organic solvents, followed by coating. FIG. 3 shows one example of a state in which a solution is supplied onto the substrate employing a glass dropper.

In the organic semiconductor film forming method of the present invention, during coating, the average volatilization rate of the non-halogenated solvents is regulated within the range of $10^{-4}$-$10^3$ mg/(sec·cm$^2$), but the preferred range of the average volatilization rate is $10^{-3}$-$10^3$ mg/(sec·cm$^2$).

Coating conditions during preparation include the temperature of the liquid coating composition (the range of 20-100° C. being preferred), the temperature of the substrate (the range of 20-100° C. being preferred), air blowing conditions onto the substrate, and the ambience during coating (coating is preferred, for example, in a substantially nitrogen ambience, which implies that the content of nitrogen in the ambience is at least 99% by volume). By regulating the above conditions, it is possible to regulate the above average volatilization rate within the above range.

During coating, as described in the present invention, refers to the duration until decrease in 95% by weight of the supplied solution is confirmed, and the average volatilization rate is regulated.

Based on the decreased weight and area of the resulting coating, a volatilization amount of the solvents per area and time was calculated. Further, the ambient pressure during coating was set at 1.33 Pa.

It is a common knowledge that when an organic semiconductor is formed on the surface of an insulating film, in order to enhance mobility, the small contact angle of water on the surface of the insulating film is preferred (refer, for example, to ADVANCED MATERIALS 2004, 16, No. 8, April 19 732). Such a high water repellent surface is highly unsuitable for the formation of a semiconductor film via coating.

However, in order to enhance targeted performance, technology to enable coating of an organic semiconductor solution onto a highly water repellent surface is essential. The present invention relates to the technology which enables the above.

In the formation of an organic semiconductor film via a coating method, organic semiconductor materials are dissolved in solvents, and the resulting solution is supplied and coated onto a substrate such as an oxidized film attached-silicon wafer, followed by drying, whereby an organic semiconductor film (also referred to as an organic semiconductor layer) is prepared. In the present invention, during coating, the average volatilization rate of liquid contained in the liquid coating composition is controlled. The organic semiconductor materials coated onto the substrate is subjected to film formation along with the volatilization of liquid contained in the liquid coating composition. During this process, the crystalline state of the organic semiconductor film is significantly changed. Crystallization of the organic semiconductor materials is further enhanced in the presence of liquid in the liquid coating composition, resulting in an enhancement in carrier mobility. At the same time, the performance of organic semiconductor elements is improved by enhancing adhesion to the surface-treated insulating layer on the substrate surface via enhancement film forming capability by volatilization of solvents.

The inventors of the present invention conducted diligent investigation and discovered the optimal average volatilization rate of liquid, contained in the liquid coating composition, which simultaneously achieved enhancement of crystallizing capability of the above organic semiconductor films and enhancement of adhesion onto the surface of the above insulating layers.

Further, it was discovered that the organic thin-film transistor, which was prepared while forming the organic semiconductor layer via the above methods for forming these organic semiconductor films, exhibited high carrier mobility and high durability while exhibiting excellent transistor characteristics.

The present invention will now be detailed.

<<Organic Semiconductor Materials>>

Organic semiconductor materials employed in the present invention will be descried.

Any organic compounds may be selected as an organic semiconductor material employed in the organic semiconductor film forming method of the present invention, as long as they function as a semiconductor. The same is applied to organic semiconductor materials employed in the organic semiconductor film constituting an organic semiconductor channel (being an active layer) in an organic thin-film transistor.

(Molecular Weight)

The molecular weight of organic semiconductor materials is preferably at least 5,000 in terms of weight average molecular weight. It is possible to determine the weight average molecular weight via GPC type high speed chromatography.

As a low-molecular weight compound, typically, there is a compound such as pentacene, and specifically, for example, there are the pentacene having a substituent group described in WO03/16599, WO03/28125, U.S. Pat. No. 6,690,029, and Japanese Patent Application 2004-107216 and the pentacene precursor described in US2003-136964.

Further, as an organic semiconductor material with a lower-molecular weight than the aforementioned molecular weight, a compound containing two or more heterocycles in the molecular structure is preferable and specifically, a compound in which the aforementioned heterocycles are thiophene rings may be cited as a preferable compound. The concerned thiophene ring may have a substituent group such as the alkyl group or may be a non-substituent ring, though it contains preferably the thiophene ring having a substituent group in each molecule, and it contains more preferably both the thiophene ring having a substituent group and non-substituent thiophene ring. Furthermore, two or more thiophene rings are preferably connected and the number of connected thiophene rings is preferably 2 to 10.

Further, according to the present invention, an oligomer having a molecular weight lower than the average molecular weight 5,000 is a preferable compound as an organic semiconductor material. As an oligomer preferably used specifically in the present invention, the thiophene oligomer may be cited.

As a thiophene oligomer preferably used in the present invention, it is preferable to include a thiophene oligomer having a partial structure in which at least two repeating units of the thiophene ring having a substituent group and repeating units of the non-substituent thiophene ring are respectively connected and set the number of thiophene rings included in the thiophene oligomer within the range from 8 to 40. The number of rings of the above mentioned thiophene rings are preferably from 8 to 20. More preferably the thiophene oligomer has a partial structure represented by following Formula (1).

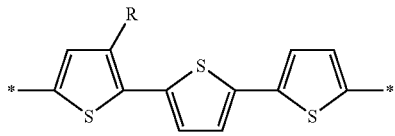

Formula (1)

In the formula, a symbol R represents a substituent.

<<Thiophene Oligomer Represented by Formula (1)>>

The thiophene oligomer represented by Formula (1) used in the present invention will be described.

Examples of a substituent represented by R in Formula (1) include: an alkyl group (for example, a methyl group, an ethyl group, a propyl group, an isopropyl group, a tert-butyl group, a pentyl group, a hexyl group, an octyl group, a dodecyl group, a tridecyl group, a tetradecyl group and a pentadecyl group); a cycloalkyl group (for example, a cyclopentyl group and a cyclohexyl group); an alkenyl group (for example, a vinyl group and an allyl group); alkynyl groups (for example, an ethynyl group and a propargyl group); an aryl group (for example, a phenyl group, a p-chlorophenyl group, a mesityl group, a tolyl group, a xylyl group, a naphthyl group, an anthryl group, an azulenyl group, an acenaphthenyl group, a fluorenyl group, a phenanthryl group, an indenyl group, a pyrenyl group and a biphenylyl group); an aromatic heterocyclic group (for example, a furyl group, a thienyl group, a pyridyl group, a pyridazyl group, a pyrimidyl group, a pyrazyl group, a triazyl group, an imidazolyl group, a pyrazolyl group, a thiazolyl group, a benzimidazolyl group, a benzoxazolyl group, a quinazolyl group, and a phthalazyl group), a heterocyclic group (for example, a pyrrolidyl group, an imidazolydyl group, a morpholyl group, and an oxazolydyl group), an alkoxy group for example, a methoxy group, an ethoxy group, a propyloxy group, a pentyloxy group, a hexyloxy group, an octyloxy group, and a dodecyloxy group), a cycloalkoxy group (for example, a cyclopentyloxy group and a cyclohexyloxy group), an aryloxy group (for example, a phenoxy group and a naphthyloxy group), an alkylthio group (for example, a methylthio group, an ethylthio group, a propylthio group, a pentylthio group, a hexylthio group, an octylthio group, and a dodecylthio group), a cycloalkylthio group (for example, a cyclopentylthio group and a cyclohexylthio group), an arylthio group (for example, a phenylthio group and a naphthylthio group), an alkoxycarbonyl group (for example, a methyloxycarbonyl group, an ethyloxycarbonyl group, a butyloxycarbonyl group, an octyloxycarbonyl group, and a dodecyloxycarbonyl group), an aryloxycarbonyl group (for example, a phenyloxycarbonyl group and a naphthyloxycarbonyl group), a sulfamoyl group (for example, an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group, and a 2-pyridylaminosulfonyl group), an acyl group (for example, an acetyl group, an ethylcarbonyl group, a propylcarbonyl group, a pentylcarbonyl group, a cyclohexylcarbonyl group; an octylcarbonyl group, a 2-ethylhexylcarbonyl group, a dodecylcarbonyl group, a phenylcarbonyl group, a naphthylcarbonyl group, and a pyridylcarbonyl group), an acyloxy group (for example, an acetyloxy group, an ethylcarbonyloxy group, a butylcarbonyloxy group, an octylcarbonyloxy group, a dodecylcarbonyloxy group, and a phenylcarbonyloxy group), an amido group (for example, a methylcarbonylamino group, an ethylcarbonylamino group, a dimethylcarbonylamino group, a propylcarbonylamino group, a pentylcarbonylamino group, a cyclohexylcarbonylamino group, a 2-ethylhexylcarbonylamino group, an octylcarbonylamino group, a dodecylcarbonylamino group, a phenylcarbonylamino group, and a naphthylcarbonylamino group), a carbamoyl group (for example, an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecylaminocarbonyl group, a phenylaminocarbonyl group, a naphthylaminocarbonyl group, and a 2-pyridylaminocarbonyl group), a ureido group (for example, a methylureido group, an ethylureido group, a pentylureido group, a cyclohexylureido group, an octylureido group, a dodecylureido group, a phenylureido group, a naphthylureido group, and a 2-pyridylaminoureido group), a sulfinyl group (for example, a methylsulfonyl group, an ethylsulfonyl group, a butylsulfonyl group, a cyclohexylsulfinyl group, a 2-ethylhexylsulfinyl group, a dodecylsulfinyl group, a phenylsulfonyl group, a naphthylsulfinyl group, and a 2-pyridylsulfinyl group), an alkylsulfonyl group (for example, a methylsulfonyl group, an ethylsulfonyl group, a butylsulfonyl group, a cyclohexylsulfonyl group, a 2-ethylhexylsulfonyl group, and a dodecylsulfonyl group), an arylsulfonyl group (for example, a phenylsulfonyl group, a naphthylsulfonyl group, and a 2-pyridylsulfonyl group), an amino group (for example, an amino group, an ethylamino group, a dimethylamino group, a butylamino group, a cyclopentylamino group, a 2-ethylhexylamino group, a dodecylamino group, an anilino group, a naphthylamino group, and a 2-pyridylamino group), an halogen atom (for example, a fluorine atom, a chlorine atom, and a bromine atom), a fluorinated hydrocarbon group (for example, a fluoromethyl group, a trifluoromethyl group, a pentafluoroethyl group), a cyano group, a silyl group (for example, a trimethylsilyl group, a triisopropylsilyl group, a triphenylsilyl group, and a phenyldiethylsilyl group).

These substituents may further be substituted with the above substituents, and a plurality of the above substituents may join to form a ring.

Of these, the preferred substituent is an alkyl group, the more preferred one is an alkyl group having 2-20 carbon atoms, but the most preferred one is an alkyl group having 4-12 carbon atoms.

<<Terminal Group of Thiophene Oligomer>>

The terminal group of a thiophene oligomer employed in the present inventions will now be described.

It is preferable that the terminal group of the thiophene oligomers employed in the present invention has no thienyl group. Listed as preferred groups in the above terminal group are an aryl group (for example, a phenyl group, a p-chlorophenyl group, a mesityl group, a tolyl group, a xylyl group, a naphthyl group, an anthryl group, an azulenyl group, an acenaphthenyl group, a fluorenyl group, a phenanthryl group, an indenyl group, a pyrenyl group, and a biphenyl group), an alkyl group (for example, a methyl group, an ethyl group, a propyl group, an isopropyl group, a tert-butyl group, a pentyl group, a hexyl group, an octyl group, a dodecyl group, a tridecyl group, a tetradecyl group, and a pentadecyl group), a halogen atom (for example, a fluorine atom, a chlorine atom, and a bromine atom).

<<Characteristics of Steric Structure of Repeating Unit of Thiophene Oligomer>>

It is preferable that thiophene oligomers employed in the present invention have no head-to-head structure. In addition, it is more preferable to have a head-to-tail structure or a tail-to-tail structure.

With regard to the head-to-head structure, the head-to-tail structure and the tail-to-tail structure according to the present invention, reference can be made, for example, on pages 27-32 of "n Denshi Kei Yuki Kotai (n Electron Based Organic Solids" (edited by the Chemical Society of Japan, published by Gakkai Shuppan Center, 1998) and to Adv. Mater. 1998. 10, No. 2, pages 93-116. Each of the structural characteristics will now be specifically described.

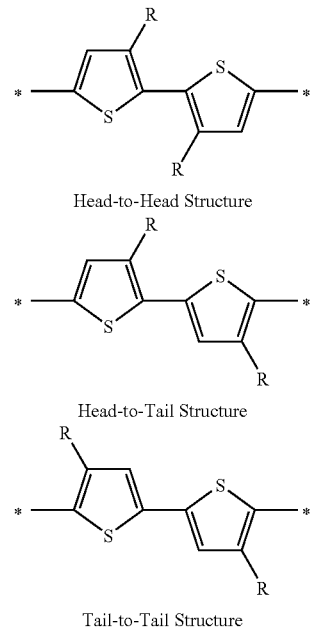

R is the same as R in the Formula (1).

Specific examples of the thiophene oligomers employed in the present invention are listed below; however, the present invention is not limited thereto.

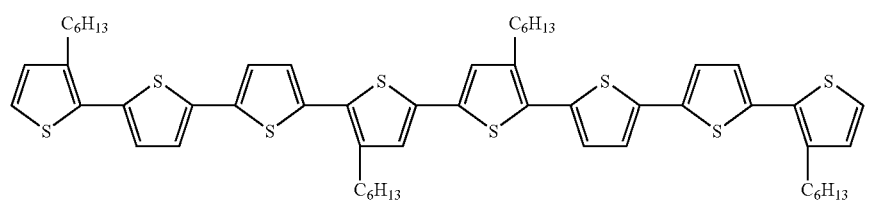

<1>

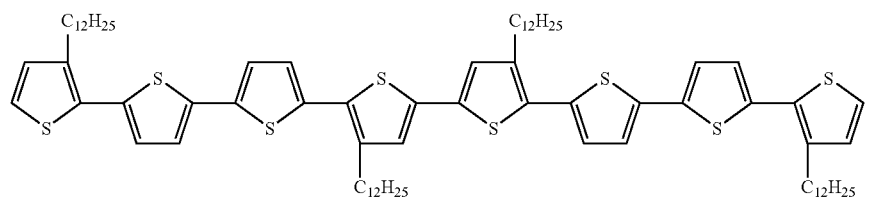

<2>

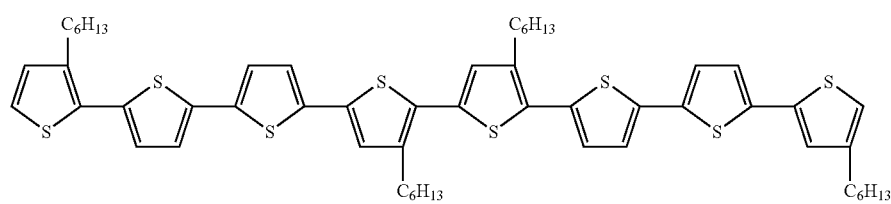

<3>

-continued
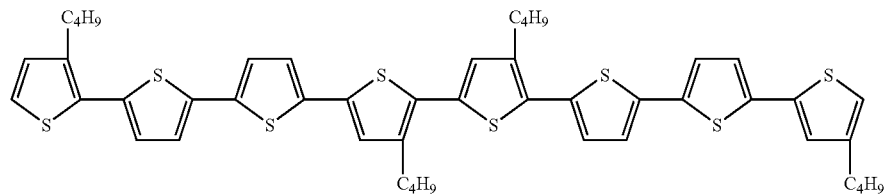
<4>
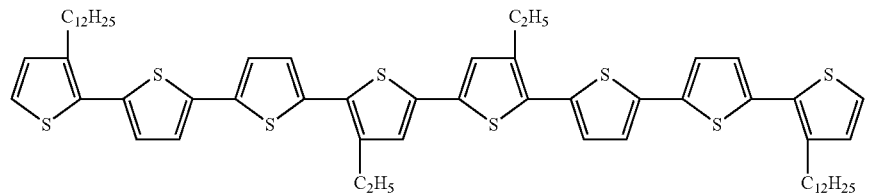
<5>
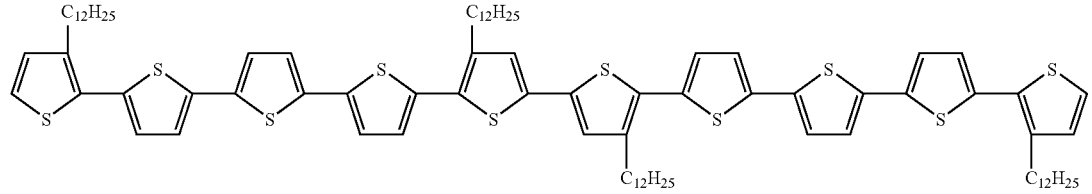
<6>
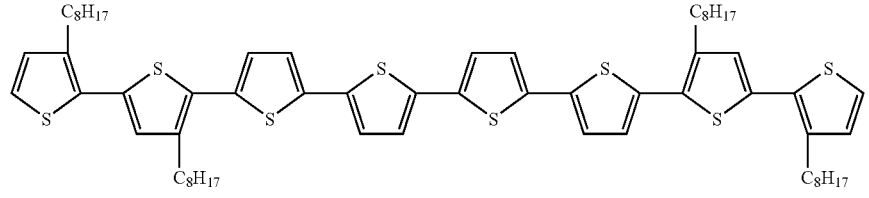
<7>
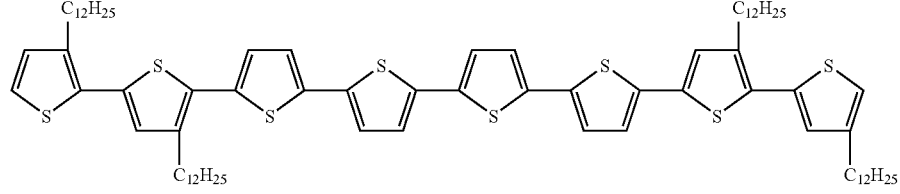
<8>
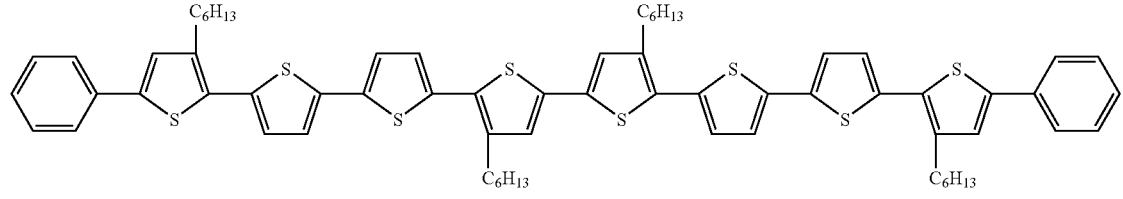
<9>
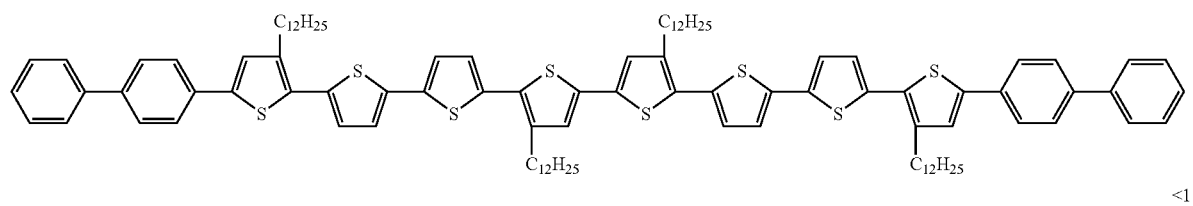
<10>
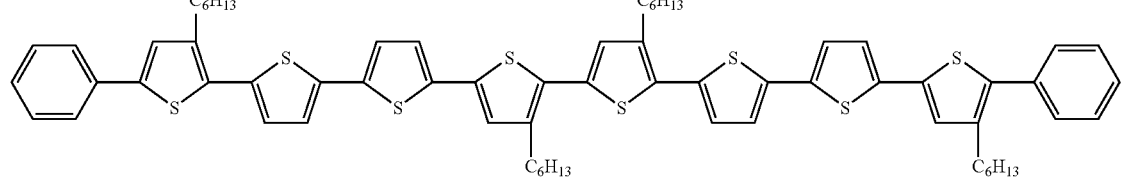
<11>

-continued
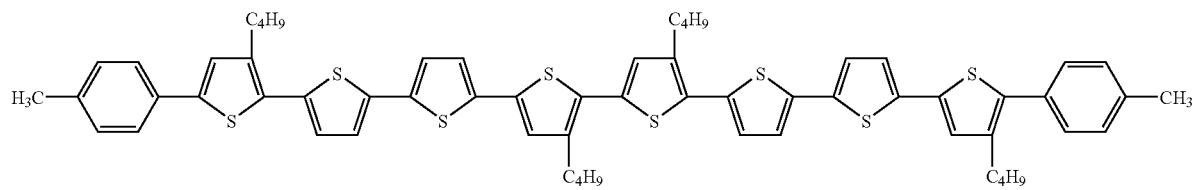
<12>
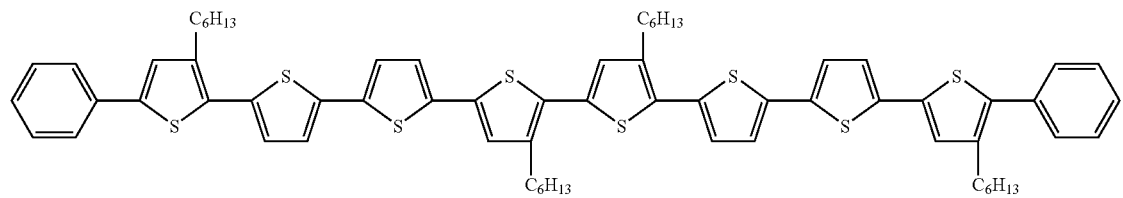
<13>
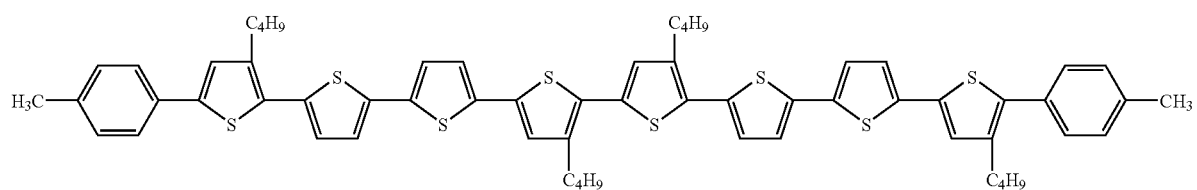
<14>
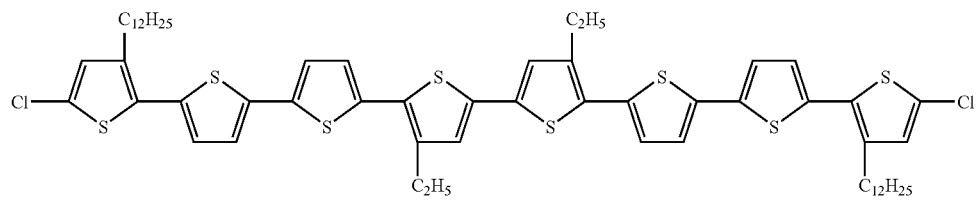
<15>
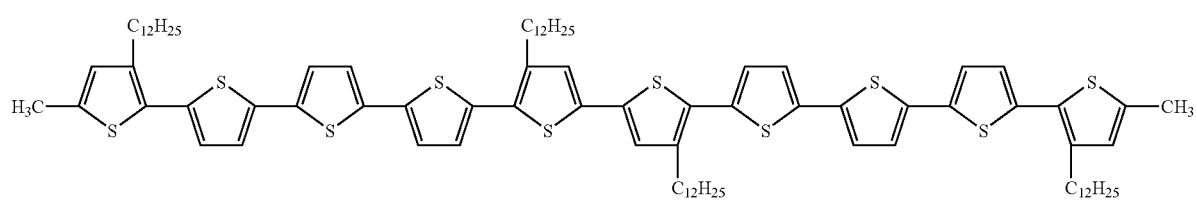
<16>
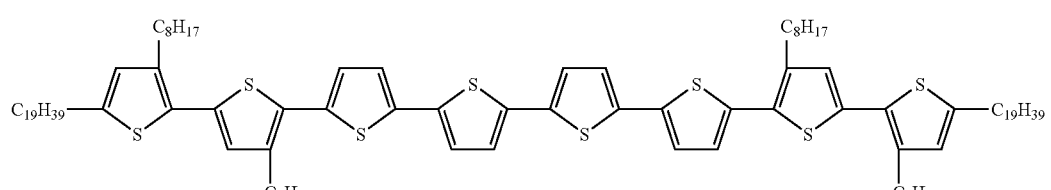
<17>
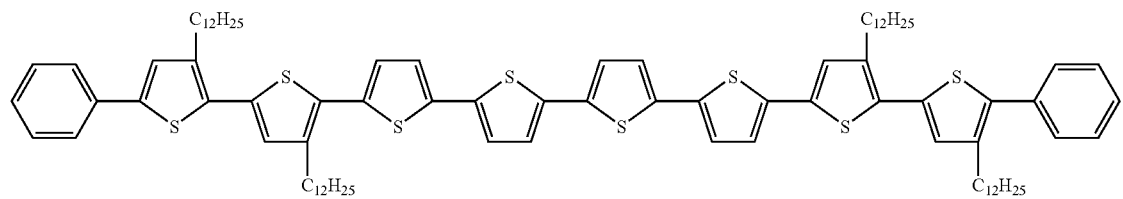
<18>
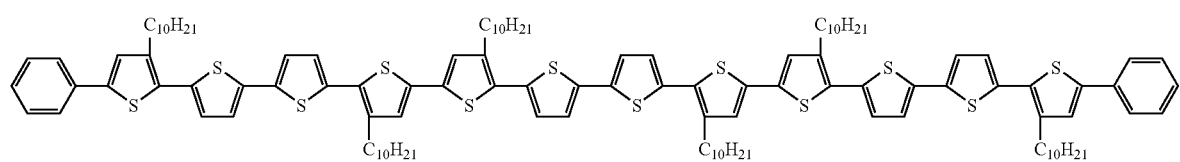
<19>

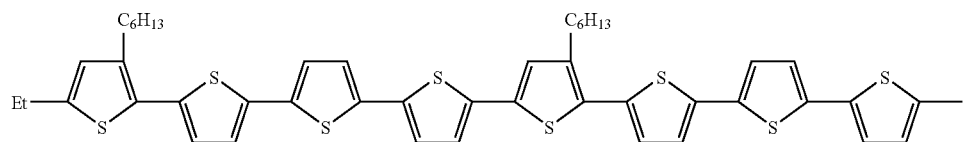

<20>

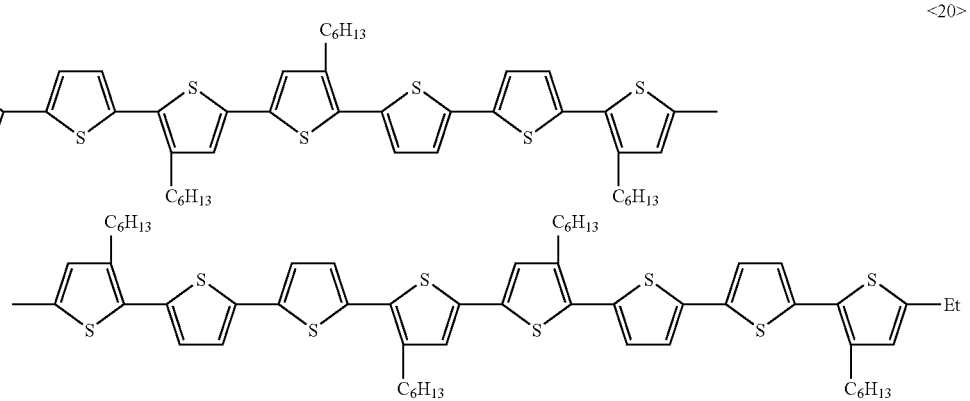

<21>

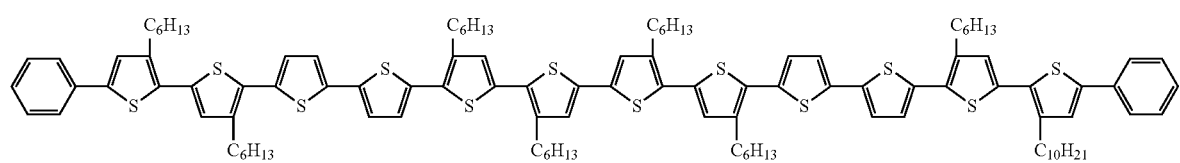

<22>

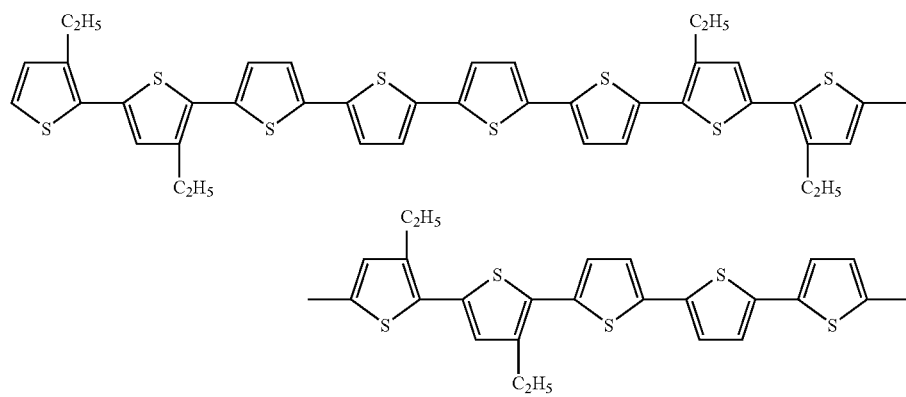

The synthetic methods of these thiophene oligomer are described in JP-A 2006-24908 (filed on Jun. 10, 2004) applied by the inventors of the present invention filed by the inventors of the present invention.

Preferable examples of the organic semiconductor material according to this invention are silylethynylpentacene compound described in Adv. Mater. 2003, 15, No. 23, December 3 (2009-2011), a compound having an acene or heteroacene nucleus described in J. Am. Chem. Soc., 2005, 127, 4986-4987, and silylethynylpentacene, and tris-alkylsilylethynylpentacene, tri-isopropylsilylethynylpentacene are preferable. And tri-isopropylsilylethynylpentacene are preferable among them.

In this invention so-called doping treatment may be carried out via incorporation, in the organic semiconductor layer, materials having a functional group such as acrylic acid, acetamide, materials having a functional group such as a dimethylamino group, a cyano group, a carboxyl group, or a nitro group; materials working as acceptor accepting an electron such as benzoquinone derivatives, tetracyanoethylene and tetracyanoquinodimethane and derivatives thereof; as well as materials which work as a donor which is an electron donor, such as materials having a functional group such as an amino group, a triphenyl group, an alkyl group, a hydroxyl group, an alkoxy group, or a phenyl group, substituted amines such as phenylenediamine, anthracene, benzanthracene, substituted benzanthracenes, pyrene, substituted pyrene, carbazole and derivatives thereof, or tetrathiafulvalene and derivatives thereof.

(Other Material)

Further, when condensed polycyclic aromatic compounds are used as an organic semiconductor material, a so-called doping treatment may be carried out via incorporation, in the organic semiconductor layer, of not only organic semiconductor materials, but also materials which work as an acceptor which receives electrons, such as acrylic acid, acetamide, materials having a functional group such as a dimethylamino group, a cyano group, a carboxyl group, or a nitro group, benzoquinone derivatives, tetracyanoethylene and tetracyanoquinodimethane and derivatives thereof, as well as materials which work as a donor which is an electron donor, such as materials having a functional group such as an amino group, a triphenyl group, an alkyl group, a hydroxyl group, an alkoxy group, or a phenyl group, substituted amines such as phenylenediamine, anthracene, benzanthracene, substituted benzanthracenes, pyrene, substituted pyrene, carbazole and derivatives thereof, or tetrathiafulvalene and derivatives thereof.

The forming method of the organic semiconductor film according to the present invention is also useful in structure formation, such as orientation of organic semiconductor material molecules of the organic semiconductor film which is subjected to doping.

<<Solvents>>

The above organic semiconductor film, when an organic thin-film transistor is structured, is formed on a substrate having a highly water repellent film such as a gate insulating film (for example, a silicon thermally oxidized folk). Consequently, solvents which dissolve organic semiconductor materials are preferably those which exhibit high affinity to the substrate.

<<Non-Halogenated Solvents>>

Heretofore, aromatic halogenated hydrocarbons such as trichlorobenzene have been employed to dissolve organic semiconductor materials such as alkyl-substituted pentacene. However, as solvents employed in the present invention, it is essential to employ non-halogenated solvents of a low environmental load. It is preferable that the above non-halogenated solvents are employed as a major component in the entire solvent (which means that the content of non-halogenated solvents in the entire solvent is at least 50% by weight).

Non-halogenated solvents include aliphatic solvents such as hexane and octane, alicyclic solvents such as cyclohexane, aromatic solvents such as benzene, toluene and xylene; ether solvents such as tetrahydrofuran, dioxane, ethylene glycol diethyl ether, anisole, benzyl ethyl ether, ethyl phenyl ether, diphenyl ether and methyl-t-butyl ether; ester solvents such as methyl acetate, ethyl acetate and ethyl cellosolve; alcohol solvents such as methanol, ethanol and isopropanol; ketone solvents such as acetone, methyl ethyl ketone, cyclohexanone, 2-hexanone, 2-heptanone and 3-heptanone; and others such as dimethylformamide, dimethylsulfoxide, diethylformamide and 1,3-dioxolan. Of these, preferred are aromatic hydrocarbon solvents (toluene and xylene) and ether solvents (tetrahydrofuran).

Further, non-halogenated solvents according to the present invention may be employed individually or in combinations of at least two types.

Further, in view of the retention of a high carrier mobility of the resulting organic semiconductor film and enhancement of film forming capability via volatilization of solvents, preferred as non-halogenated solvents according to the present invention are those in the range of a boiling point of 100-350° C.

Further, in order to accelerate dissolution of organic semiconductor materials, employed may be other solvents which result in high solubility of the above organic semiconductor materials. When these solvents are applied onto a substrate, they may be employed in the range of resulting in no repellency.

<<Simultaneously Employable Solvents (Also Referred to as Solvent Media)>>

At least a non-halogenated solvent is employed in the liquid coating composition related to formation of the organic semiconductor film of the present invention. Other solvents which are simultaneously applicable are not particularly limited. However preferably listed are methanol, ethanol, isopropanol, acetone, methyl ethyl ketone, methyl isobutyl ketone, pyrrolidone, N-methylpyrrolidone, dimethylformamide, dimethylacetamide, methyl acetate, ethyl acetate, butyl acetate, methyl lactate, ethyl lactate, butyl lactate, methyl β-ethoxypropionate, propylene glycol monomethyl ether acetate, toluene, xylene, hexane, limonene, and cyclohexane. These organic solvents may be employed in combinations of at least two types.

Further employed as ester based solvent media may be oxyisobutyric acid alkyl esters. Oxyisobutyric acid esters include α-alkoxyisobutyric acid alkyl esters such as methyl α-methoxyisobutyrate, ethyl α-methoxyisobutyrate, methyl α-ethoxyisobutyrate, or ethyl α-ethoxyisobutyrate; β-alkoxyisobutyric acid alkyl esters such as methyl β-methoxyisobutyrate, ethyl β-methoxyisobutyrate, methyl β-ethoxyisobutyrate, or ethyl β-ethoxyisobutyrate; and α-hydroxyisobutyric acid alkyl esters such as methyl α-hydroxyisobutyrate or ethyl α-hydroxyisobutyrate. Specifically employed may be methyl α-methoxyisobutyrate, methyl β-methoxyisobutyrate, methyl β-ethoxyisobutyrate, or methyl α-hydroxyisobutyrate.

<<Substrates>>

The substrate according to the present invention will now be described.

In the present invention, a substrate, which is employed to form an organic semiconductor material film, particularly, a substrate for an organic thin-film transistor varies depending on its preparation procedures such as the top-gate type or the bottom-gate type, described below. Specifically, in the production of the bottom-gate type organic thin-film transistor, it is preferable that the contact angle to water of a gate insulating film (being a thermally oxidized film formed on a polysilicon substrate) is at least 80°. In order to prepare, on a gate electrode, a gate insulating film which exhibits a high contact angle to water of at least 80°, the gate insulating film may previously be subjected to a surface treatment which includes a treatment employing silane coupling agents. Examples of preferred silane coupling agents include octadecyltrichlorosilane and octyltrichlorosilane, however the present invention is not limited thereto.

Further, preferred as such surface treatment is one which forms a thin self arrangement type film. It may be acceptable to carry out well-known orientation treatments, such as rubbing.

In the present invention, "contact angle" refers to the contact angle of water on the substrate surface onto which a liquid composition containing organic semiconductor materials has been applied, and is determined at 20° C. and 50% relative humidity, employing a contact angle meter (Type CA-DT·A, produced by Kyowa Interface Science Co., Ltd.).

It is thus possible to obtain a degree of water repellency on the substrate surface, based on the contact angle of water.

<<Production of Organic Thin-Film Transistors>>

Organic thin-film transistors are divided mainly into a top gate type, which has a support having thereon a source electrode, and a drain electrode which are connected by an organic semiconductor channel (being an active layer), further having thereon a gate electrode via a gate insulating layer, and a bottom gate type which has a support having thereon initially a gate electrode, further having thereon a source electrode and a drain electrode which are connected by a semiconductor channel via a gate insulating layer. The organic thin-film transistor prepared by the organic semiconductor film forming method according to the present invention may be either the top gate type or the bottom gate type, and their configurations are not critical.

In an example of the aforesaid bottom gate type organic thin-film transistor, which is one of the preferred embodiments of the present invention, an organic thin-film transistor has a support having thereon a gate electrode, a gate insulating film, an active layer, a source electrode, and a drain electrode so that each of them is optimally arranged.

Accordingly, the organic thin-film transistor according to the present invention is formed in such a manner that, for example, after forming the gate electrode on the support, the gate insulation film is formed, and after its formation on the gate insulation film, the active layer (being the thin organic semiconductor material layer (film)) based on the above-mentioned method, each of the source and the drain electrodes is formed.

Further, for example, after forming the gate insulation film, a source and drain electrode pattern is formed, and an organic semiconductor channel is formed via patterning between the above source and drain electrodes.

As noted above, the organic semiconductor thin-film transistor according to the present invention is prepared in such a manner that the gate electrode, the gate insulation film, the active layer (the thin organic semiconductor material layer), the source electrode, and the drain electrode are optimally arranged on the support, if desired, via being arbitrarily subjected to patterning.

Other components which constitute the organic thin-film transistor, except for the active layer (the organic semiconductor layer (film)) of a method for forming organic semiconductor film and an organic semiconductor film formed by said method in the present invention, will mow be described.

According to the present invention, the materials for forming the source electrode, drain electrode, and gate electrode, if they are conductive materials, are not restricted specifically and various metallic materials can be used. For example, platinum, gold, silver, nickel, chromium, copper, iron, tin, antimony, lead, tantalum, indium, palladium, tellurium, rhenium, iridium, aluminum, ruthenium, germanium, molybdenum, tungsten, tin-antimony oxide, indium-tin oxide (ITO), fluorine doped zinc oxide, zinc, carbon, graphite, glassy carbon, silver paste, carbon paste, lithium, beryllium, sodium, magnesium, potassium, calcium, scandium, titanium, manganese, zirconium, gallium, niobium, alloy of sodium and potassium, mixture of magnesium and copper, mixture of magnesium and silver, mixture of magnesium and aluminum, mixture of magnesium and indium, mixture of aluminum and aluminum oxide, and mixture of lithium and aluminum are used, though specifically, platinum, gold, silver, copper, aluminum, indium, ITO, and carbon are preferable.

As an electrode forming method, a method for forming an electrode from a conductive film formed from one of the raw materials listed above by vacuum evaporation or sputtering by the well-known photolithographic method or lift-off method and a method for etching a metallic foil such as aluminum or copper using a resist by heat transfer or ink jet may be cited.

Further, as an electrode forming method, a method for patterning a conductive fine-particle dispersed liquid or a conductive polymer solution or dispersed liquid directly by the ink jet method and a method for forming an electrode from a coated film by lithography or laser ablation may also be cited. Furthermore, a method for patterning ink containing a conductive polymer or conductive fine particles or conductive paste by the printing method such as letterpress printing, intaglio printing, litho printing, or screen printing can be used.

Or, well-known polymers the conductivity of which is improved by doping, for example, conductive polyaniline, conductive polypyrrole, conductive polythiophene, and complex of polyethylene dioxythiophene and polystyrene sulfonic acid are used preferably. Among them, the conductive polymers having a low electric resistance on the contact surface with the semiconductor layer are preferable.

As a metallic material (metallic fine particles) of conductive fine particles, platinum, gold, silver, cobalt, nickel, chromium, copper, iron, tin, antimony, lead, tantalum, indium, palladium, tellurium, rhenium, iridium, aluminum, ruthenium, germanium, molybdenum, tungsten, and zinc can be used. Specifically those having a work function of 4.5 eV or more such as platinum, gold, silver, copper, cobalt, chromium, iridium, nickel, palladium, molybdenum, and tungsten are preferable.

As a method for manufacturing such metallic fine-particle dispersions, the physical generation methods such as the in-gas evaporation method, sputtering method, and metallic vapor synthetic method and the chemical generation methods for reducing metallic ions in the liquid phase and generating metallic fine particles such as the colloid method and the co-precipitation method may be cited. However, metallic fine-particle dispersions manufactured by the colloid method described in JP-A H11-76800, JP-A H11-80647, JP-A H11-319538 and 2000-239853 and the in-gas evaporation method described in JP-A 2001-254185, JP-A 2001-53028, JP-A 2001-35255, JP-A 2000-124157, and JP-A 2000-123634 are preferable.

The average particle diameter of dispersed metallic fine particles is preferably 20 nm or smaller.

Further, the metallic fine-particle dispersions preferably contain a conductive polymer and when it is patterned, pressed, and heated, thus a source electrode and a drain electrode are formed, the electrodes can make ohmic contact with the organic semiconductor layer by the conductive polymer. That is, the surfaces of the metallic fine particles are surrounded by the conductive polymer, thus the contact resistance with the semiconductor is lowered, and the metallic fine particles are heated and fused, so that the effect of the present invention can be enhanced.

As a conductive polymer, a well-known conductive polymer the conductivity of which is improved by doping is used preferably and for example, conductive polyaniline, conductive polypyrrole, conductive polythiophene, and complex of polyethylene dioxythiophene and polystyrene sulfonic acid are used preferably.

The content of metallic fine particles is preferably 0.00001 to 0.1 as a mass ratio. When the mass ratio exceeds the upper limit, the fusion of the metallic fine particles may be obstructed.

When forming electrodes with these metallic fine-particle dispersions, after the source electrode and drain electrode are formed, the metallic fine particles are preferably fused by heating. Further, when forming electrodes, it is possible to apply a pressure of almost 1 to 50000 Pa and then almost 1,000 to 10,000 Pa to the metallic fine particles to promote fusion.

As a method for patterning the aforementioned metallic fine-particle dispersions as an electrode, when patterning directly by the ink jet method, as an ejecting method of the ink jet head, the known methods such as a continuously jetting type ink jet method of an on-demand type and an electrostatic suction type such as a piezo method and a Bubble Jet (registered trademark) method can be used.

As a heating and pressurizing method, not only the method used for a heating laminator but also the well-known methods can be used.

As a gate insulating layer, various insulating films can be used, though specifically an inorganic oxide film having a high relative dielectric constant is preferable.

As an inorganic oxide, silicon oxide, aluminum oxide, tantalum oxide, titanium oxide, tin oxide, vanadium oxide, barium/strontium titanate, barium zirconate titanate, lead zirconium titanate, lead lanthanium titanate, strontium titanate, barium titanate, barium/magnesium fluoride, bismuth titanate, strontium/bismuth titanate, strontium/bismuth tantalate, bismuth tantalate niobate, and trioxide yttrium may be cited. Among them, silicon oxide, aluminum oxide, tantalum oxide, and titanium oxide are preferable. Inorganic nitrides such as silicon nitride and aluminum nitride can be used preferably.

As forming method of the above-mentioned film, the drive processes such as the vacuum deposition method, molecular beam epitaxial growth method, ion cluster beam method, low energy ion beam method, ion plating method, CVD method, sputtering method, and atmospheric pressure plasma method, the coating methods such as the spray coating method, spin coating method, blade coating method, dip coating method, casting method, roll coating method, bar coating method, and die coating method, and the wet processes such as the patterning methods of printing and ink jet may be cited and these methods can be used depending on the material.

As a wet process, a method for coating and drying a liquid obtained by dispersing fine particles of inorganic oxide in an optional organic solvent medium or water using a dispersing agent such as a surface active agent whenever necessary and the so-called sol-gel method for coating and drying an oxide precursor, for example, an alkoxide solvent are used.

Among them, the atmospheric pressure plasma method and sol-gel method are preferable.

The insulating film forming method by the plasma film forming process under the atmospheric pressure is a process of discharging under the atmospheric pressure or pressure close to the atmospheric pressure, plasma-exciting reactive gas, and forming a film on a substrate and the method is described in JP-A H11-61406, JP-A H11-133205, JP-A 2000-121804, JP-A 2000-147209, JP-A 2000-185362 and so on. By this method, a highly functional film can be formed with high productivity.

The insulating film may be subjected to preliminarily surface treatment, examples of which are preferably above mentioned treatment by silane coupling agent, orientation treatment via rubbing and so on.

Further, polyimide, polyamide, polyester, polyacrylate, photo-setting resin of photoradical polymerization system or photocationic polymerization system, copolymerizate containing acrylonitrile component, polyvinyl phenol, polyvinyl alcohol, novolak resin, and cyanoethyl pullulan can be used as an organic compound film.

The wet process is preferable as an organic compound film forming method,

An inorganic oxide film and an organic compound film can be laminated and used together with each other. Further, the film thickness of the insulating films is generally 50 nm to 3 μm and preferably 100 nm to 1 μm.

Further, the support is composed of glass or a flexible plastic sheet and for example, a plastic film can be used as a sheet. As a plastic film, for example, films composed of polyethylene terephthalate (PET), polyethylene naphthalate (PEN), polyether sulfone (PES), polyether imide, polyether ether ketone, polyphenylene sulfide, polyarylate, polyimide, polycarbonate (PC), cellulose triacetate (TAC), or cellulose acetate propionate (CAP) may be cited. By use of a plastic film like this, compared with a case using a glass substrate, lightweight can be realized, and the portability can be enhanced, and the shock resistance can be improved.

FIG. 1 shows configuration examples of the organic film transistor relating to the present invention.

In FIG. 1(a), on a glass support 6, a pattern is formed by depositing gold or others using a mask, and then h a source electrode 2 and a drain electrode 3 are formed, and an organic semiconductor material layer 1 is formed between them, and a gate insulating layer 5 is formed on it, and furthermore, a gate electrode 4 is formed on it, thus an organic TFT is formed.

FIGS. 1(b) and (c) show other configuration examples of the organic thin film transistor of the top gate type.

Further, FIGS. 1(d) through (f) show configuration examples of the organic thin film transistor (TFT) of the bottom gate type.

FIG. 2(d) shows examples that the gate electrode 4 is formed on the support 6, then the gate insulating layer 5 is formed, the source electrode 2 and drain electrode 3 are formed thereon, and the organic semiconductor material layer 1 is formed on the gate insulating layer between the source electrode and drain electrode, whereby an organic TFT of the bottom gate type is formed. Similarly, other configuration examples are shown in FIGS. 2(e) and 2(f). FIG. 2(f) shows an example that the gate electrode 4 is formed on the support 6, and then the gate insulating layer 5 is formed, and the organic semiconductor material layer 1 is formed on it, and further the source electrode 2 and drain electrode 3 are formed whereby an organic TFT of the bottom gate type is formed.

Figure 2:
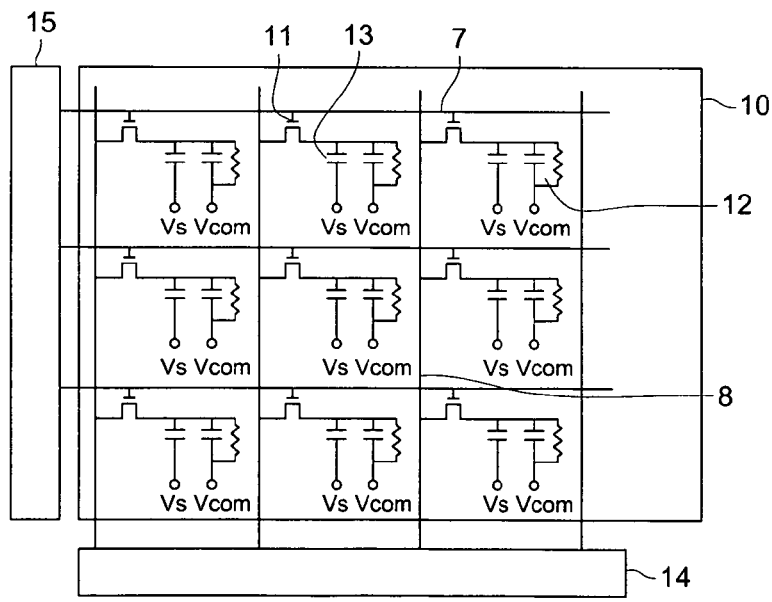
FIG. 2 is a schematic view showing one example of the approximately equivalent circuit of an organic TFT sheet.

FIG. 2 is an example of a schematic equivalent circuit diagram of the TFT sheet for an output element such as a liquid crystal and cataphoresis element.

A TFT sheet 10 has a plurality of organic TFTs 11 arranged in the matrix shape. Numeral 7 indicates a gate bus line of each organic TFT 11 and 8 indicates a source bus line of each organic TFT 11. To the source electrode of each organic TFT 11, an output element 12 is connected and it is, for example, a liquid crystal or electrophoresis element and constitutes pixels on a display unit. A pixel electrode may be used as an input electrode of a photosensor. In the example shown in the drawing, a liquid crystal as an output element is represented by an equivalent circuit composed of a resistor and a capacitor. Numeral 13 indicates a storage capacitor, 14 a vertical drive circuit, and 15 a horizontal drive circuit.

The present invention will now be specifically described with reference to examples, however the present invention is not limited thereto.

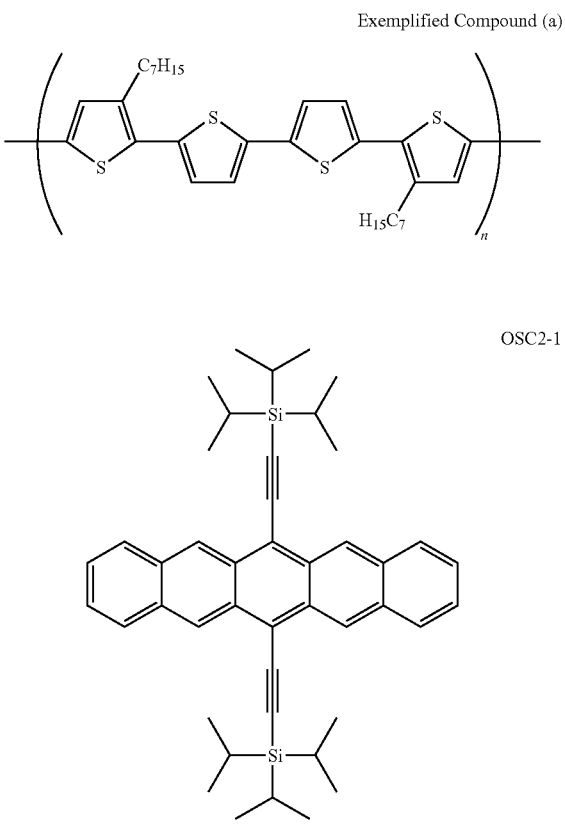

-continued

OSC2-2

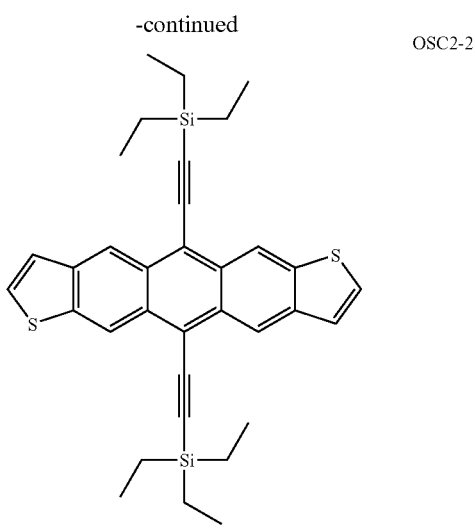

EXAMPLE 1

Formation of Organic Semiconductor Film 1

Example

A 200 nm thick thermally oxidized silicon film was formed on an n type Si wafer of a specific resistance of 0.02Ω·cm, which was designated as a gate insulating film.

Subsequently, Exemplified Compound (a), as an organic semiconductor material, was blended with $N_2$ gas bubbled-toluene, whereby a 1% by weight dispersion was prepared. The resulting 30 mg dispersion was dripped onto the surface of the above oxidized silicon film, employing a glass pipette, whereby Organic Semiconductor Film 1 was formed.

The resulting semiconductor film was circular, resulting in an area of 1 $cm^2$ and its average thickness was 50 nm. During coating, the average volatilization rate of the solvent was maintained at 3×10 mg/(sec·$cm^2$), and Organic Semiconductor Film 1 was formed. All the above processes of solution preparation as well as film forming and drying were carried out under a nitrogen ambience.

<<Evaluation of Organic Semiconductor Film 1>>

Resulting Organic Semiconductor Film 1 was evaluated as follows. An organic thin-film transistor was prepared employing Organic Semiconductor Film 1, and the carried mobility and threshold value were evaluated.

Further, the surface of the resulting film was subjected to gold deposition employing a mask. As described above, Organic Thin-film Transistor 1 at channel length L of 30 μm and channel width W of 1 mm was prepared. The resulting organic thin-film transistor worked well as a p-channel channel enhanced type FET, resulting in a carrier mobility in the saturated region of 0.01 $cm^2$/V·s, which was determined by the following method.

(Determination of Carrier Mobility)

Carrier mobility ($cm^2$/V·s) was obtained from the saturated region of I-V characteristics of a thin-film transistor.

<<Formation of Organic Semiconductor Films 2-40>>

Each of Organic Semiconductor Films 2-40 was formed in the same manner as Organic Semiconductor 1, except that the average volatilization rate, the substrate temperature, the solvent type, the semiconductor material, and the coating method (dripping or IJ (employing an ink-jet head)) were changed as described in Tables 1 and 2.

A liquid composition, which was prepared employing a semiconductor materials and a solvent, may range from completely dissolved state to a dispersed state in which the material is not completely dissolved.

Further, with regard to coating methods, in the case of coating via dripping, an organic semiconductor film was formed as shown in FIG. 3, while in the case of employing IJ (ink-jet) (not shown), an organic conductor film was formed by continuously ejecting a 20 mg liquid composition onto the surface of the above oxidized silicon film, employing a commercial piezoelectric system ink-jet head for organic solvents. The average volatilization rate was regulated in the same manner as in the dripping method.

The area of the semiconductor film, prepared as above, was 600 $μm^2$, while the average thickness was 50 nm. All the above processes of preparation of the liquid composition, as well as film forming and drying were carried out under a nitrogen atmosphere.

<<Formation of Organic Semiconductor Films 41 and 42>>

Each of Organic Semiconductor Films 41 and 42 was formed in the same manner as Organic Semiconductor 1, except that the average volatilization rate, the substrate temperature, the solvent type, the semiconductor material, and the coating method (dripping or IJ (employing an ink-jet head)) were changed as described in Table 2.

During the formation of Organic Semiconductors 41 and 41, dripping* was carried out so that the dripping weight reached 300 mg and the dripped area resulted in a circle of a diameter of 4 cm.

Further, abbreviations in Tables 1 and 2 refer to the following.

Solvent type (*): prepared so that the solute in a solution reached 0.1% by weight (*1): unstable film formation PC: propylene carbonate CP: 1-chloropentane DCB: ortho-dichlorobenzene CH: cyclohexane THF: tetrahydrofuran In the mixed solvent case, preparation was carried out so that cyclohexane reached 80% by weight and tetrahydrofuran reached 20% by weight.

<<Evaluation of Organic Semiconductors 2-42>>

By employing resulting Organic Semiconductors 2-42, each of Organic Thin-film Transistor 2-34 was prepared and subsequently evaluated.

Tables 1 and 2 show the results.

TABLE 1

| Organic Thin-film Transistor | Average Volatilization Rate mg/(sec·cm$^2$) | Substrate Temperature °C. | Solvent Type (*) | Semi-conductor | Coating Method | Mobility | Remarks |
|---|---|---|---|---|---|---|---|
| 1 | $3 \times 10^1$ | 60 | toluene | Exemplified Compound (a) | Dripping | 0.01 | Example |
| 2 | $1 \times 10^2$ | 90 | toluene | Exemplified Compound (a) | Dripping | 0.008 | Example |
| 3 | $6.6 \times 10^2$ | 30 | toluene | Exemplified Compound (a) | IJ | 0.03 | Example |
| 4 | $3.3 \times 10^5$ | 90 | toluene | Exemplified Compound (a) | IJ | 0.000001 | Comparative Example |
| 5 | $3 \times 10^1$ | 60 | toluene | <9> | Dripping | 0.05 | Example |
| 6 | $1 \times 10^2$ | 90 | toluene | <9> | Dripping | 0.02 | Example |
| 7 | $6.6 \times 10^2$ | 30 | toluene | <9> | IJ | 0.15 | Example |
| 8 | $3.3 \times 10^5$ | 90 | toluene | <9> | IJ | 0.00007 | Comparative Example |
| 9 | $3 \times 10^1$ | 60 | toluene | OSC2-2 | Dripping | 0.08 | Example |
| 10 | $1 \times 10^2$ | 90 | toluene | OSC2-2 | Dripping | 0.05 | Example |
| 11 | $6.6 \times 10^2$ | 30 | toluene | OSC2-2 | IJ | 0.2 | Example |
| 12 | $3.3 \times 10^5$ | 90 | toluene | OSC2-2 | IJ | 0.0001 | Comparative Example |
| 17 | $3 \times 10^1$ | 60 | toluene | OSC2-1 | Dripping | 0.6 | Example |
| 18 | $1 \times 10^2$ | 90 | toluene | OSC2-1 | Dripping | 0.5 | Example |
| 19 | $6.6 \times 10^2$ | 30 | toluene | OSC2-1 | IJ | 0.8 | Example |
| 20 | $3.3 \times 10^5$ | 90 | toluene | OSC2-1 | IJ | 0.0003 | Comparative Example |
| 21 | $3 \times 10^1$ | 60 | toluene | OSC2-1 | Dripping | 0.15 | Example |
| 22 | $1 \times 10^2$ | 90 | toluene | OSC2-1 | Dripping | 0.1 | Example |
| 23 | $8 \times 10^{-5}$(*1) | 10 | tetralin | OSC2-1 | Dripping | 0.0007 | Comparative Example |
| 24 | $2 \times 10^{-4}$ | 30 | tetralin | OSC2-1 | Dripping | 0.01 | Example |
| 25 | $1.1 \times 10^{-3}$ | 60 | tetralin | OSC2-1 | Dripping | 0.06 | Example |
| 26 | $7.3 \times 10^{-3}$ | 90 | tetralin | OSC2-1 | Dripping | 0.09 | Example |
| 27 | $1.8 \times 10^2$ | 30 | tetralin | OSC2-1 | IJ | 0.8 | Example |
| 28 | $5.5 \times 10^2$ | 90 | tetralin | OSC2-1 | IJ | 0.8 | Example |

TABLE 2

| Organic Thin-film Transistor | Average Volatilization Rate mg/(sec·cm$^2$) | Substrate Temperature °C. | Solvent Type (*) | Semi-conductor | Coating Method | Mobility | Remarks |
|---|---|---|---|---|---|---|---|
| 29 | $1.7 \times 10^2$ | 60 | PC | OSC2-1 | IJ | 0.7 | Example |
| 30 | $3.7 \times 10^2$ | 100 | PC | OSC2-1 | IJ | 0.6 | Example |
| 31 | $1 \times 10^2$ | 90 | CP | OSC2-1 | Dripping | 0.0008 | Comparative Example |
| 32 | $6.6 \times 10^2$ | 30 | CP | OSC2-1 | IJ | 0.002 | Comparative Example |
| 33 | $3 \times 10^1$ | 50 | DCB | OSC2-1 | Dripping | 0.001 | Comparative Example |
| 34 | $1 \times 10^2$ | 80 | DCB | OSC2-1 | Dripping | 0.001 | Comparative Example |
| 35 | $6.6 \times 10^2$ | 25 | DCB | OSC2-1 | IJ | 0.003 | Comparative Example |
| 36 | $3.3 \times 10^5$ | 80 | DCB | OSC2-1 | IJ | $3 \times 10^{-7}$ | Comparative Example |
| 37 | $1 \times 10^2$ | 60 | CH | OSC2-1 | Dripping | 0.1 | Example |
| 38 | $6.6 \times 10^2$ | 15 | CH | OSC2-1 | IJ | 0.08 | Example |
| 39 | $1 \times 10^2$ | 60 | CH | <9> | Dripping | 0.01 | Example |
| 40 | $6.6 \times 10^2$ | 15 | CH | <9> | IJ | 0.08 | Example |
| 41 | $5 \times 10^1$ | 80 | THF | <9> | Dripping* | 0.01 | Example |
| 42 | $5 \times 10^{-1}$ | 50 | CH, THF | <9> | Dripping* | 0.08 | Example |

Based on Tables 1 and 2, it is seen that the organic semiconductor film (also referred to as the organic semiconductor layer), prepared by the organic semiconductor film forming method of the present invention, exhibits high carrier mobility, and in the organic thin-film transistor having the organic semiconductor film of the present invention, an organic semiconductor channel is formed which exhibits excellent semiconductor characteristics such as a low threshold value of gate voltage and results in no variation of characteristics when FET characteristics are repeatedly determined.

The invention claimed is:

1. An organic semiconductor film forming method comprising the steps of;

coating a liquid coating composition containing an organic semiconductor material and a non-halogenated solvent onto a substrate, and drying the liquid coating composition containing an organic semiconductor material and a non-halogenated solvent coated on the substrate, wherein an average volatilization rate of the non-halogenated solvent during coating is $10^{-4}$-$10^3$ mg/(sec·cm$^2$).

2. The organic semiconductor film forming method of claim 1, wherein the average volatilization rate of the non-halogenated solvent during coating is $10^{-3}$-$10^3$ mg/(sec·cm$^2$).

3. The organic semiconductor film forming method of claim 1, wherein the average volatilization rate of the non-halogenated solvent during coating is controlled by controlling temperature of the substrate or temperature of the liquid coating composition.

4. The organic semiconductor film forming method of claim 1, wherein a weight average molecular weight of the organic semiconductor material is at most 5,000.

5. The organic semiconductor film forming method of claim 1, wherein the organic semiconductor material contains an alkylthiophene oligomer.

6. The organic semiconductor film forming method of claim 1, wherein the organic semiconductor material is a pentacene derivative.

7. The organic semiconductor film forming method of claim 1, wherein the non-halogenated solvent is an aromatic hydrocarbon solvent.

8. The organic semiconductor film forming method of claim 1, wherein the substrate is one which has not been subjected to a surface treatment.

9. The organic semiconductor film forming method claim 1, wherein temperature of the aforesaid substrate is 20-100° C.

10. The organic semiconductor film forming method of claim 1, wherein temperature of the liquid coating composition is 20-100° C.

11. The organic semiconductor film forming method of claim 1, wherein the liquid coating composition onto the substrate is substantially carried out in an ambience of nitrogen gas.

* * * * *